United States Patent
Motieian Najar et al.

(10) Patent No.: US 12,128,444 B2
(45) Date of Patent: Oct. 29, 2024

(54) BROADBAND ULTRASOUND TRANSDUCERS AND RELATED METHODS

(71) Applicant: Texas Instruments Incorporated, Dallas, TX (US)

(72) Inventors: Mohammad Hadi Motieian Najar, Santa Clara, CA (US); Ali Kiaei, San Jose, CA (US); Baher Haroun, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 1102 days.

(21) Appl. No.: 16/170,671

(22) Filed: Oct. 25, 2018

(65) Prior Publication Data
US 2020/0130012 A1    Apr. 30, 2020

(51) Int. Cl.
| | |
|---|---|
| *B06B 1/06* | (2006.01) |
| *G10K 15/06* | (2006.01) |
| *H10N 30/06* | (2023.01) |
| *H10N 30/074* | (2023.01) |
| *H10N 30/20* | (2023.01) |
| *H10N 30/30* | (2023.01) |

(Continued)

(52) U.S. Cl.
CPC ............ *B06B 1/0622* (2013.01); *G10K 15/06* (2013.01); *H10N 30/06* (2023.02); *H10N 30/074* (2023.02); *H10N 30/2047* (2023.02); *H10N 30/308* (2023.02); *H10N 30/87* (2023.02); *B06B 1/0292* (2013.01)

(58) Field of Classification Search
CPC .... B06B 1/0622; B06B 1/0292; G10K 15/06; H01L 41/047; H01L 41/0973; H01L 41/1138; H01L 41/29; H01L 41/314
See application file for complete search history.

(56) References Cited

U.S. PATENT DOCUMENTS

| | | | | |
|---|---|---|---|---|
| 7,608,534 B2* | 10/2009 | Yun | ..................... | B81C 1/00301 438/618 |
| 9,618,481 B2* | 4/2017 | Kruger | ................... | G01N 29/24 |
| 2010/0094105 A1* | 4/2010 | Porat | ..................... | H10N 30/80 310/322 |

(Continued)

OTHER PUBLICATIONS

Kupnik, M. et al., "CMUTs for Air Coupled Ultrasound with Improved Bandwidth," 2011 IEEE International Ultrasonics Symposium Proceedings, pp. 592-595, 4 pages.

*Primary Examiner* — Isam A Alsomiri
*Assistant Examiner* — Abdallah Abulaban
(74) *Attorney, Agent, or Firm* — Ray A. King; Frank D. Cimino

(57) ABSTRACT

Broadband ultrasound transducers and related methods are disclosed herein. An example ultrasonic transducer disclosed herein includes a substrate and a first membrane supported by the substrate. The first membrane is to exhibit a first frequency response when oscillated. The example ultrasonic transducer includes a second membrane supported by the substrate. The second membrane is to exhibit a second frequency response different from the first frequency response when oscillated. The example ultrasonic transducer includes a third membrane supported by the substrate. The third membrane is to exhibit one of the second frequency response or a third frequency response different from the first frequency response and the second frequency response when oscillated. A shape of the first membrane is to differ from a shape of the second membrane and a shape of the third membrane.

16 Claims, 7 Drawing Sheets

(51) Int. Cl.
*H10N 30/87* (2023.01)
*B06B 1/02* (2006.01)

(56) References Cited

U.S. PATENT DOCUMENTS

| | | | |
|---|---|---|---|
| 2012/0242754 A1* | 9/2012 | Ohashi | B41J 2/14233 |
| | | | 347/68 |
| 2015/0139452 A1* | 5/2015 | Park | H04R 23/00 |
| | | | 381/150 |
| 2015/0215705 A1* | 7/2015 | Kang | H04R 17/00 |
| | | | 381/190 |
| 2018/0003678 A1* | 1/2018 | Rothberg | B81B 7/007 |
| 2018/0015504 A1* | 1/2018 | Zhao | B06B 1/0292 |

* cited by examiner

1

BROADBAND ULTRASOUND TRANSDUCERS AND RELATED METHODS

FIELD OF THE DISCLOSURE

This disclosure relates generally to ultrasound transducers and, more particularly, to broadband ultrasound transducers and related methods.

BACKGROUND

An ultrasound transducer transmits and receives acoustic waves in the ultrasonic range. A micromechanical ultrasonic transducer, such as a piezoelectric micromachined ultrasound transducer (PMUT) or a capacitive micromachined ultrasonic transducer (CMUT), includes a membrane to detect or excite ultrasonic waves through a medium such as air via vibrations of the membrane.

SUMMARY

An example ultrasonic transducer disclosed herein includes a substrate and a first membrane supported by the substrate. The first membrane is to exhibit a first frequency response when oscillated. The example ultrasonic transducer includes a second membrane supported by the substrate. The second membrane is to exhibit a second frequency response different from the first frequency response when oscillated. The example ultrasonic transducer includes a third membrane supported by the substrate. The third membrane is to exhibit one of the second frequency response or a third frequency response different from the first frequency response and the second frequency response when oscillated. A shape of the first membrane is to differ from a shape of the second membrane and a shape of the third membrane.

An example method to manufacture an ultrasonic transducer includes patterning a first membrane on a substrate. The first membrane is to exhibit with a first frequency response when oscillated. The example method includes patterning a second membrane on the substrate. The second membrane is to exhibit a second frequency response when oscillated. The example method includes patterning a third membrane on the substrate. The third membrane is to exhibit one of the second frequency response or a third frequency response different from the first frequency response and the second frequency response when oscillated. A shape of the first membrane is to differ from a shape of the second membrane and a shape of the third membrane.

An example method for transmitting ultrasonic waves includes electrically stimulating a first membrane of an ultrasonic transducer. The first membrane is to transmit a first wave at a first frequency. The example method includes electrically stimulating a second membrane of the ultrasonic transducer. The second membrane is to transmit a second wave at the first frequency. The first membrane and the second membrane are disposed about a third membrane of the ultrasonic transducer. A shape of the third membrane is to differ from a shape of the first membrane and a shape of the second membrane. The transmission of the first wave by the first membrane and the second wave by the second membrane is to form a symmetric radiation pattern.

Figure 1:
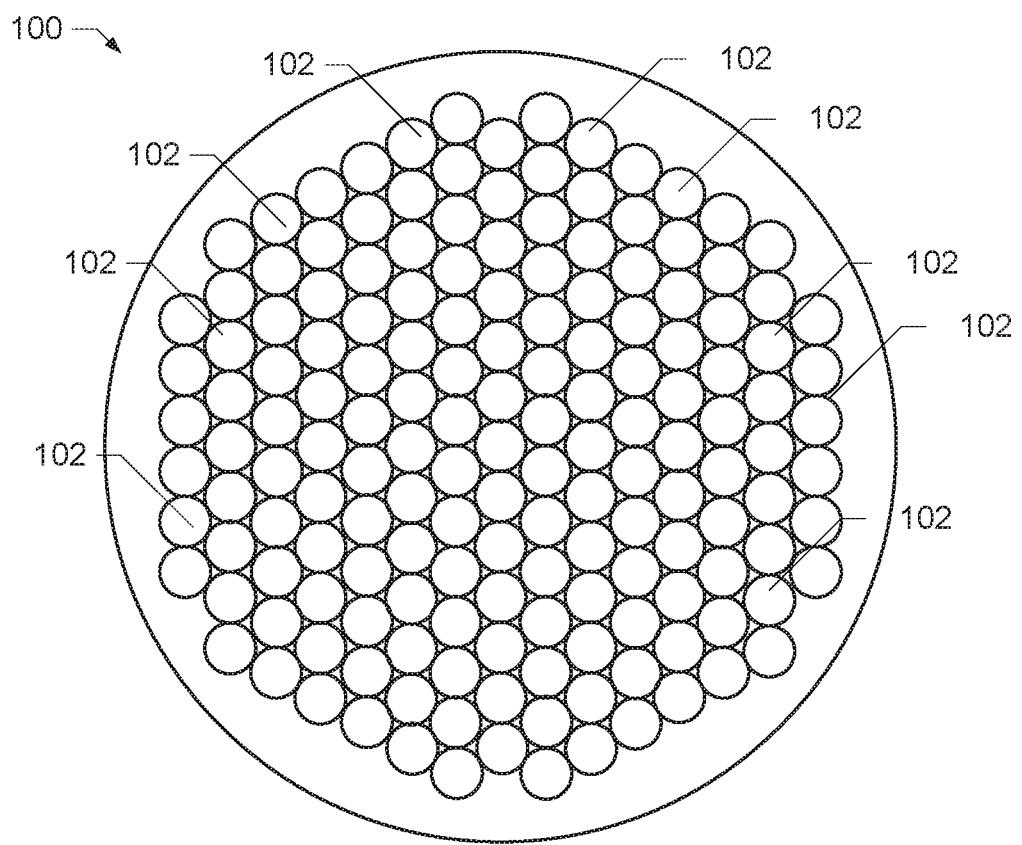
FIG. 1 illustrates a known transducer array.

The figures are not to scale. Instead, the thickness of the layers or regions may be enlarged in the drawings. In general, the same reference numbers will be used throughout the drawing(s) and accompanying written description to refer to the same or like parts. As used in this patent, stating that any part (e.g., a layer, film, area, region, or plate) is in any way on (e.g., positioned on, located on, disposed on, or formed on, etc.) another part, indicates that the referenced part is either in contact with the other part, or that the referenced part is above the other part with one or more intermediate part(s) located therebetween. Stating that any part is in contact with another part means that there is no intermediate part between the two parts. Although the figures show layers and regions with clean lines and boundaries, some or all of these lines and/or boundaries may be idealized. In reality, the boundaries and/or lines may be unobservable, blended, and/or irregular.

DETAILED DESCRIPTION

A micromechanical ultrasonic transducer such as a piezoelectric micromachined ultrasound transducer (PMUT) or a capacitive micromachined ultrasonic transducer (CMUT) includes a membrane to detect or excite ultrasonic waves through a medium such as air via vibrations of the membrane. Known airborne ultrasonic transducers typically are associated with a single frequency and a low bandwidth. In an effort to increase a bandwidth of an ultrasonic transducer, some known ultrasonic transducers include a plurality of CMUT cells forming an array with a range of frequency responses. FIG. 1 illustrates a known transducer array 100 including a plurality of CMUT cells 102 arranged in a circular array. However, the known transducer array 100 of FIG. 1 has a large footprint to accommodate the plurality of CMUT cells 102. Further, the known transducer array 100 of FIG. 1 has a low fill factor, or an amount of area of the array that is filled by the CMUT cells 102 as compared to an amount of empty space. Further, ultrasound waves emitted by the known transducer array 100 of FIG. 1 can exhibit a non-uniform radiation pattern or beam pattern due to the CMUT cells 102 producing different frequency responses.

Disclosed herein are example broadband ultrasonic transducers including membranes that generate different frequency responses, thereby increasing a bandwidth of the transducer as compared to known ultrasonic transducers, such as the known transducer array 100 of FIG. 1. The membranes of example ultrasonic transducers disclosed herein have various shapes, including, for instance, circular membranes, trapezoidal-shaped membranes, ring-shaped membranes. Design features of the individual membranes such as shape, size, thickness, etc. can be selected so as to provide for membranes with different frequency responses (e.g., resonant frequencies).

The design features of the membranes, the number of membranes, and/or the layout or arrangement of the membranes of the example transducers disclosed herein can be selected to provide for a particular range of frequencies. Thus, example transducers disclosed herein are tunable in that the membrane design and/or layout can be selected during manufacturing to provide for a transducer operable over a particular frequency range. As a result of the various designs of the membranes and/or the membrane layout, the range of frequencies over which disclosed example transducers are operative increases, thereby broadening the bandwidth of the transducers. Example transducers disclosed herein can be designed to detect ultrasonic waves over a range of frequencies. Some example transducers disclosed herein emit ultrasonic waves having a symmetric or substantially symmetric radiation pattern based on the layout of membranes associated with the same frequency response. Also, some membrane layouts disclosed herein increase a fill factor of the transducer by minimizing an area of the transducer that is not occupied by a membrane and, thus, increasing the capability of the transducer to detect or emit waves.

Figure 2:
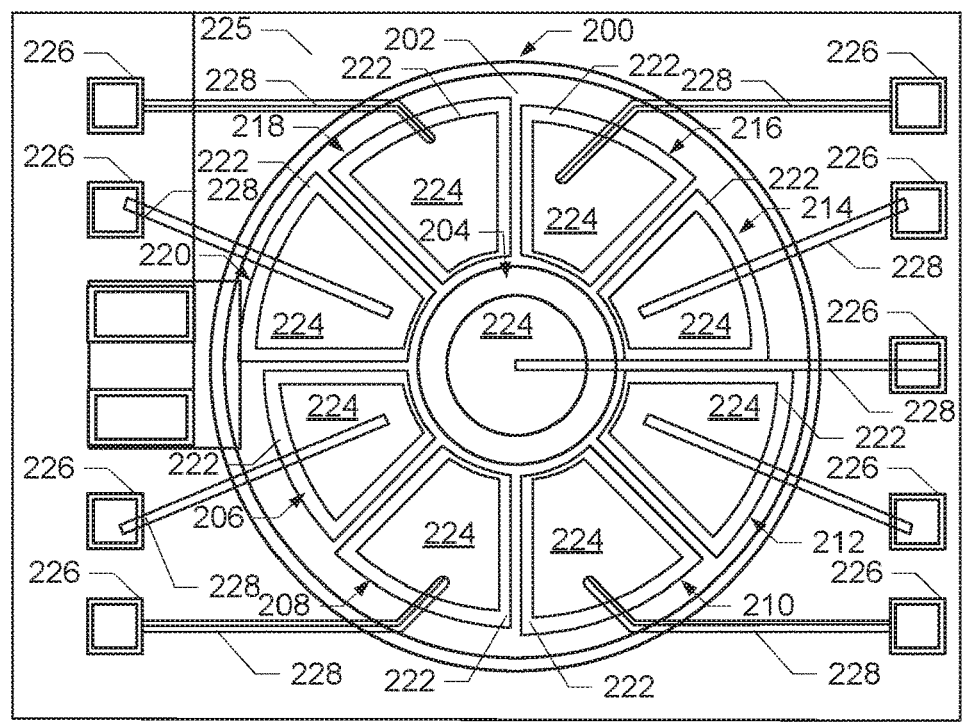
FIG. 2 illustrates a first example transducer including membranes in a first example membrane pattern in accordance with teachings of this disclosure.

FIG. 2 is a top view of an example transducer 200 in accordance with teachings of this disclosure. As discussed herein, the example transducer 200 of FIG. 2 is fabricated using PMUT fabrication techniques. However, disclosed example transducers can alternatively be fabricated using CMUT fabrication techniques, as discussed below.

The example transducer 200 includes a first substrate 202 to support a plurality of membranes. The first substrate 202 can include a semiconductor material such as a silicon wafer. The example transducer 200 includes a first membrane 204, second membrane 206, a third membrane 208, a fourth membrane 210, a fifth membrane 212, and a sixth membrane 214, a seventh membrane 216, an eighth membrane 218, and a ninth membrane 220. The example transducer 200 can include additional or fewer membranes than shown in FIG. 2 (e.g., five membranes, ten membranes, n membranes). In the example of FIG. 2, the each of the first through ninth membranes 204, 206, 208, 210, 212, 214, 216, 218, 220 includes a piezoelectric layer 222 and a first (e.g., top) electrode 224 patterned on the piezoelectric layer 222. The example membranes 204, 206, 208, 210, 212, 214, 216, 218, 220 include a second (e.g., bottom) electrode (FIG. 4) patterned below the piezoelectric layer 222. The membranes 204, 206, 208, 210, 212, 214, 216, 218, 220 are spaced apart from the first substrate 202 via an insulating layer (illustrated in FIG. 4).

In the example of FIG. 2, the first substrate 202 is coupled to (e.g., bonded to) a second substrate 225 including electrical bond pads 226. The electrodes 224 of the membranes 204, 206, 208, 210, 212, 214, 216, 218, 220 are coupled to the electrical bond pads 226 via electrical traces 228 to provide for electrical connections between the transducer 200 and, for instance, other circuitry coupled to the second substrate 225.

As illustrated in FIG. 2, the first membrane 204 is disposed at a center of the transducer 200 and the second through ninth membranes 206, 208, 210, 212, 214, 216, 218, 220 are disposed about the first membrane 204 to form a substantially circular ring around the first membrane 204. For instance, the second membrane 206 is disposed opposite from, or across from, the sixth membrane 214 relative to the first membrane 204. The shape(s) of the membranes 206, 208, 210, 212, 214, 216, 218, 220 can be defined based on the shape(s) of the piezoelectric layer 222 and/or the electrodes 224, which can be patterned or etched to define the membrane shape(s). For example, in FIG. 2, the first membrane 204 is circular shaped and the second through ninth membranes 206, 208, 210, 212, 214, 216, 218, 220 are substantially trapezoidal shaped with curved edges forming ring segment shapes or segments of an annulus (e.g., a ring-shaped band).

As illustrated in FIG. 2, the shape of the membranes 204, 206, 208, 210, 212, 214, 216, 218, 220 and the layout or arrangement of the second through ninth membranes 206, 208, 210, 212, 214, 216, 218, 220 about the first membrane 204 maximizes an area of the transducer 200 that is occupied by the membranes. Thus, as compared the known transducer array 100 of FIG. 1 with the individual CMUT cells 102 arranged in rows, the layout of the example membranes of FIG. 2 increases a fill factor of the transducer 200 and, thus increases the capability of the transducer 200 to detect or emit ultrasound waves. The first through ninth membranes 204, 206, 208, 210, 212, 214, 216, 218, 220 can have different shapes, sizes, and/or arrangements than illustrated in FIG. 2.

The respective membranes 204, 206, 208, 210, 212, 214, 216, 218, 220 of the transducer 200 mechanically deform or vibrate when subjected to, for instance, electrical stimulation. The oscillations of the respective membranes 204, 206, 208, 210, 212, 214, 216, 218, 220 are characterized by the frequency response of the membranes. The respective frequency responses of the membranes 204, 206, 208, 210, 212, 214, 216, 218, 220 can be based on, for instance, a size of the membrane, a shape of the membrane, a thickness of one or more materials forming the membranes (e.g., the piezoelectric layer 222), a stiffness of the material(s) forming the membrane, and/or boundary conditions such as a coupling of a portion of the membrane to the first substrate 202 for support. For example, a smaller sized membrane can be associated with a higher frequency response as compared to a larger sized membrane. The example transducer 200 is tunable in that the frequency range of the transducer 200 can be selected based on features of the membranes. A bandwidth of the example transducer 200 can be selectively broadened or narrowed based on the number of membranes in the transducer 200, the design of the membranes, and the frequency responses of the membranes.

Figure 3:
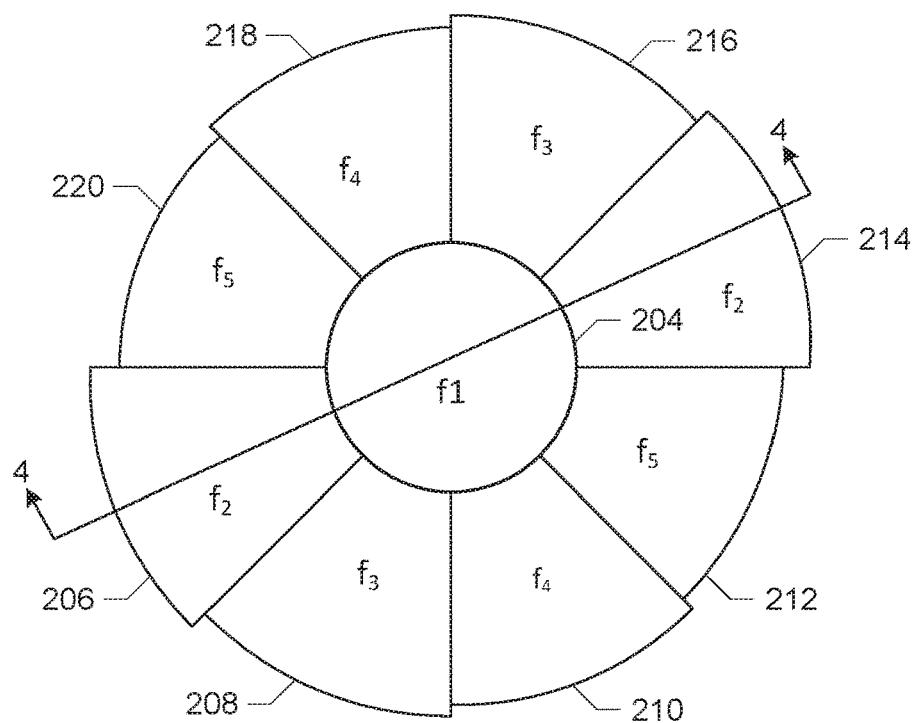
FIG. 3 is a top view of the first example membrane layout of the transducer of FIG. 2.

FIG. 3 is a schematic illustration showing a top view of the first through ninth membranes 204, 206, 208, 210, 212, 214, 216, 218, 220 of the example transducer 200 of FIG. 2 and the associated frequency responses of the membranes. In the example of FIG. 3, the first membrane 204 is associated with a first frequency $f_1$. Respective pairs of the second through ninth membranes 206, 208, 210, 212, 214, 216, 218, 220 that are disposed along an axis of the transducer 200 passing through a center the first membrane 204 are associated with the same frequency $f_n$. For instance, referring to FIG. 3, the second membrane 206 and the sixth membrane 214 are associated with a second frequency $f_2$, the third membrane 208 and the seventh membrane 216 are associated with a third frequency $f_3$, the fourth membrane 210 and the eighth membrane 218 are associated with a fourth frequency $f_4$, and the fifth membrane 212 and the ninth membrane 220 are associated with a fifth frequency $f_5$. For instance, for airborne applications (e.g., when airborne ultrasonic waves are detected by the membranes or when ultrasonic waves are emitted by the membranes into the air), example frequency values can include $f_1$=160 kHz, $f_2$=180 kHz, $f_3$=200 kHz, $f_4$=220 kHz, $f_5$=240 kHz.

In the example of FIGS. 2 and 3, the application of voltage to the membrane(s) 204, 206, 208, 210, 212, 214, 216, 218, 220 causes the membrane(s) 204, 206, 208, 210, 212, 214, 216, 218, 220 to vibrate at the respective frequencies $f_1$, $f_2$, $f_3$, $f_4$, $f_5$. The transducer 200 transmits ultrasound waves in response to the application of voltage to the electrode(s) 224 of the membrane(s) 204, 206, 208, 210, 212, 214, 216, 218, 220. The symmetric arrangement of the pairs of membranes 206, 208, 210, 212, 214, 216, 218, 220 exhibiting the same frequency response $f_2$, $f_3$, $f_4$, $f_5$ about the first membrane 204 results in a substantially symmetric radiation pattern or beam pattern of the waves emitted by the transducer 200. For example, ultrasound waves emitted by the second membrane 206 and the sixth membrane 216 that are each associated with the second frequency $f_2$ will exhibit similar properties with respect to, for instance, direction in which the waves are transmitted as compared to if the second membrane 206 and the sixth membrane 216 were associated with different frequencies. Similarly, ultrasound waves emitted at the fourth frequency $f_4$ by the fourth membrane 210 and the eighth membrane 218 contribute to the radiation of waves by the transducer 200 in a substantially symmetric beam pattern as compared to if the fourth membrane 210 and the eighth membrane 218 were associated with different frequencies. Thus, the layout of the membranes of the example transducer 200 affects the directivity pattern of the waves emitted by the transducer 200 to more efficiently direct the waves emitted by the transducer 200. However, in some other examples, the example transducer 200 can be used to generate a non-symmetric radiation pattern based on, for instance, a position or alignment of a wave receiver relative to the transducer and a corresponding position and/or orientation of the transducer.

Figure 4:
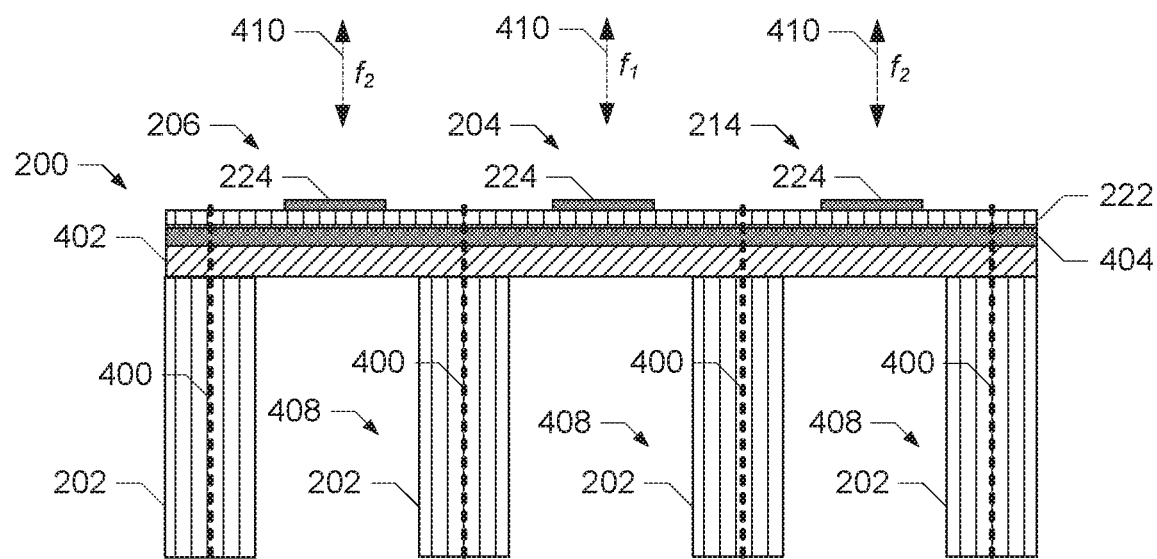
FIG. 4 is a cross-sectional view of the first example transducer of FIGS. 2 and 3 taken along the 4-4 line of FIG. 3.

FIG. 4 is a cross-sectional view of the example piezoelectric transducer 200 of FIGS. 2 and 3 taken along the 4-4 line of FIG. 3. In particular, FIG. 4 illustrates a cross-sectional view of the first membrane 204, the second membrane 206, and the sixth membrane 214. However, a cross-sectional view of the transducer 200 taken along a line extending through the first membrane 204 and two other of the membranes 208, 210, 212, 216, 218, 220 may be same or substantially similar as the example cross-sectional view the first, second, and sixth membranes 204, 206, 214 shown in FIG. 4, but may differ with respect to, for instance, a thickness of a piezoelectric layer of one or more of the membranes. In the example of FIG. 4, the dashed lines 400 represent the boundaries of the membranes 204, 206, 214.

As shown in FIG. 4, each membrane 204, 206, 214 of the transducer 200 is supported by a portion of the first substrate 202 (e.g., a silicon wafer). An insulator 402, which can include silicon dioxide, is deposited on the first substrate 202. A bottom electrode 404 is deposited on the insulator 402. The bottom electrode 404 can be patterned from a film including titanium (Ti) and platinum (Pt). The piezoelectric layer 222, which can include, for instance, lead zirconate titanate (PZT) or aluminum nitride (AlN), is deposited on the bottom electrode 404. The top electrode 224 of the respective membranes 204, 206, 214 is formed from, for instance, a Pt/Ti layer. The first substrate 202 is etched (e.g., using a deep relative ion etch process) to form respective cavities 408 that release the membranes 204, 206, 214 and enable the membranes 204, 206, 214 to oscillate when stimulated.

The different shapes and/or sizes of the respective membranes 204, 206, 214 and, thus, the frequency response of the membranes, can be defined based on the patterning and etching of the bottom electrode 404, the piezoelectric layer 222, and/or the top electrode 224. For example, photolithography can be used to pattern the piezoelectric layer 222 and the electrodes 224, 404 to form the respective membranes 204, 206, 214. As represented by arrows 410 of FIG. 4, movement of the membranes 204, 206, 214 produces the different frequency responses $f_1$ and $f_2$ associated with the respective membranes 204, 206, 214.

In some examples, each of the top electrodes 224, or drive electrodes, of the membranes 204, 206, 208, 210, 212, 216, 218, 220 are connected to one another through electrical routings. The bottom electrode 404 serves as a ground electrode for the top electrodes 224. In some examples, an electrical stimulus is applied to the transducer 200 that excites each of the membranes 204, 206, 208, 210, 212, 216, 218, 220 (or is received by the membranes), thereby causing each of the membranes to vibrate at their resonant frequencies (e.g., $f_1$, $f_2$ ... $f_n$). As a result of the excitation of all of the transducer membranes in parallel and the corresponding frequency responses of each of the membranes, the membranes produce a radiation pattern having a frequency bandwidth that is greater than the bandwidth of the individual transducer membranes alone. Thus, the example transducer 200 provides for a range of broadband frequency responses.

Figure 5:
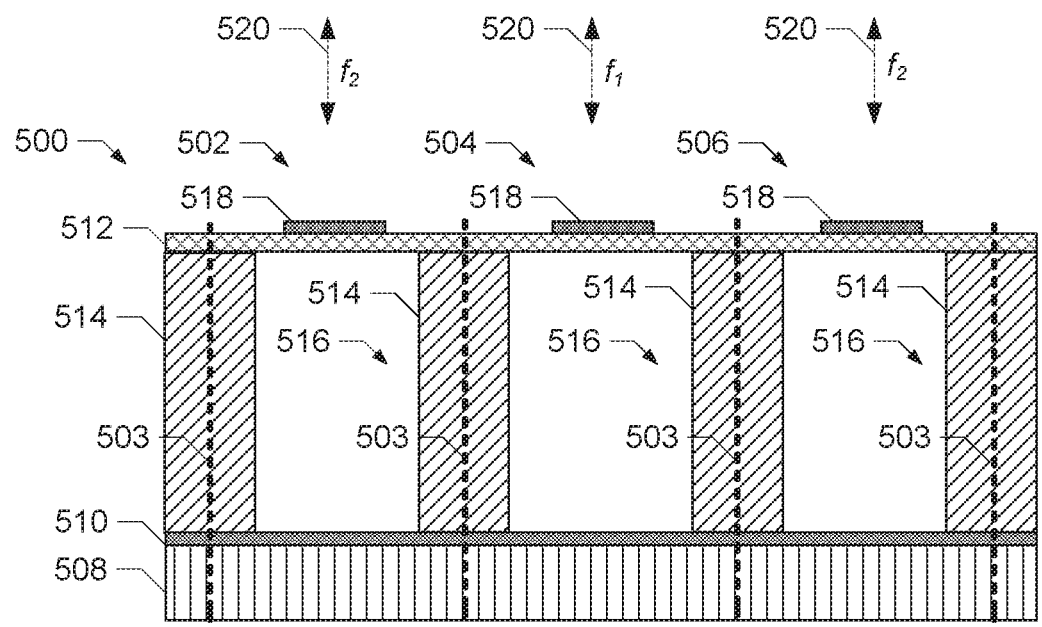
FIG. 5 is a cross-sectional view of a second example transducer in accordance with teachings of this disclosure.

Although the example transducer 200 of FIGS. 2-4 is discussed above in connection with a piezoelectric transducer, example transducers disclosed herein can alternatively be fabricated using CMUT fabrication techniques. FIG. 5 illustrates a cross-sectional view of an example capacitive transducer 500 in accordance with teachings of this disclosure. The example transducer 500 of FIG. 5 includes a first membrane 502, a second membrane 504, and a third membrane 506. The membranes of the example capacitive transducer 500 can be arranged in a similar configuration as the example piezoelectric transducer 200 of FIGS. 2-4 such that the first membrane 502 is disposed at a center of the transducer 500 and the second and third membranes 504, 506 are disposed about the first membrane 502. The dashed lines 503 of FIG. 5 represent the boundaries of the membranes 502, 504, 506.

The example capacitive transducer 500 includes a substrate 508 (e.g., a silicon wafer). A bottom electrode 510 formed from, for instance, a Pt/Ti layer is deposited on the substrate 508. Each of the membranes 502, 504, 506 includes a diaphragm 512 spaced apart from the substrate 508 via insulating supports 514. Each membrane 502, 504, 506 includes a cavity 516 that is defined by the diaphragm 512, the substrate 508, and the insulating supports 514 associated with the respective membranes 502, 504, 506. The diaphragm 512 can include, for instance, silicon nitride. A top electrode 518 of each membrane 502, 504, 506 is formed from, for instance, a Pt/Ti layer. As disclosed above in connection with the example piezoelectric transducer 200 of FIGS. 2-4, the different shapes and/or sizes of the respective membranes 502, 504, 506 of the example capacitive transducer 500 can be defined based on the patterning and etching of the diaphragm 512 and/or the top electrode 518.

As represented by arrows 520 of FIG. 5, the membranes 502, 504, 506 move (e.g., flex, oscillate) when, for instance, a voltage is applied between the bottom and top electrodes 510, 518 via electrical connections of the electrodes 510, 518 with, for instance, the electrical bond pads 226 of FIG. 2. Oscillation of the membranes 502, 504, 506 is based on frequency response (e.g., resonant frequency) associated with the membranes. For example, the first membrane 502 is associated with a first frequency $f_1$ and the second and third membranes 504, 506 are associated with a second frequency $f_2$. The frequency response of the membranes 502, 504, 506 can be based on, for instance, a size of the membranes 502, 504, 506, a shape of the membranes 502, 504, 506, and/or a stiffness of the materials of, for instance, the diaphragm 512. As disclosed above in connection with the example piezoelectric transducer 200 of FIG. 2, the membranes 502, 504, 506 can be arranged to enable the transducer 500 to produce a substantially symmetric radiation or beam pattern when emitting ultrasonic waves based on the frequency associated with each membrane.

Figure 8:
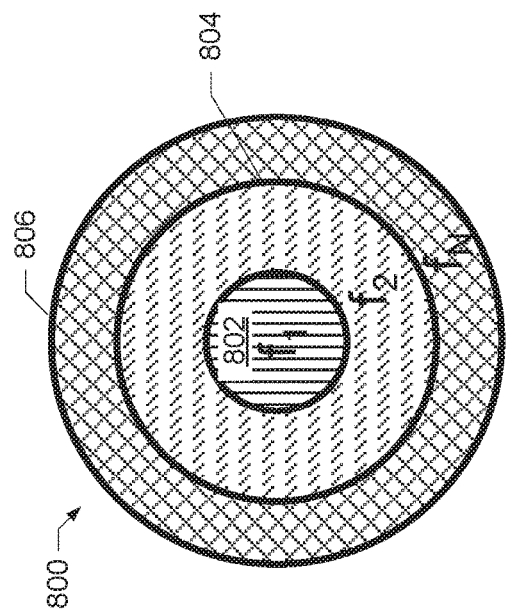
FIGS. 6-8 illustrate example alternate membrane layouts that may be implemented with the first example transducer of FIGS. 2-4 and/or the second example transducer of FIG. 5.
Figure 6:
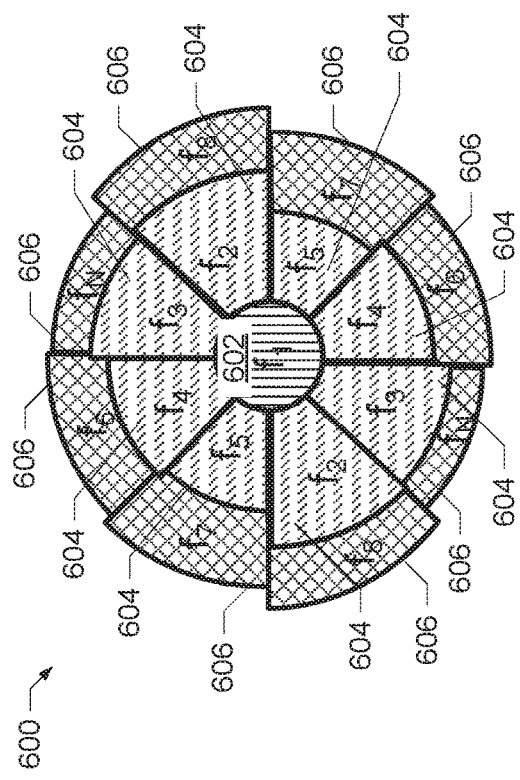
Figure 7:
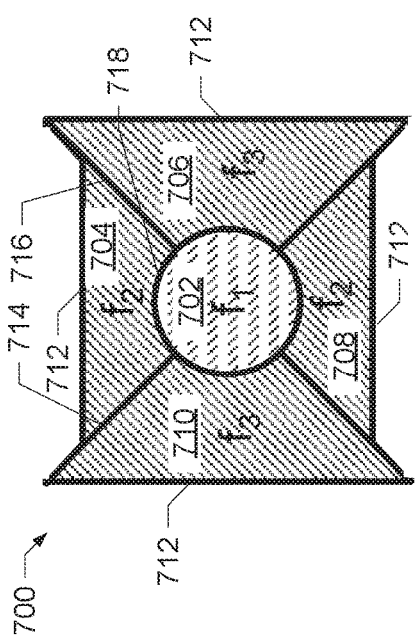

FIGS. 6-8 illustrate top views of alternate example membrane layouts that may be implemented with the example transducers 200, 500 disclosed herein. FIG. 6 illustrates a first example membrane layout 600 based in part on the example membrane layout shown in FIG. 3, including a first membrane 602 and a plurality of second membranes 604 having a substantially trapezoidal shape (e.g., ring segment shape) disposed about the first membrane 602. The example membrane layout 600 of FIG. 6 includes a plurality of third membranes 606 disposed about the second membranes 604, such that the second membranes 604 and third membranes 606 form multi-sectioned rings about the first membrane 602. The first, second, and third membranes 602, 604, 606 can be formed via etching and/or patterning materials used to form the transducer including the example membrane layout 600 of FIG. 6, such as the piezoelectric material 222 of FIGS. 2 and 4, the diaphragm 512 of FIG. 5, the top electrode(s) 224, 518 of FIGS. 2, 4, and 5.

As illustrated in FIG. 6, the first, second, and third membranes 602, 604, 606 are associated with different frequencies. In the example of FIG. 6, respective pairs of the second membranes 604 disposed along an axis passing through a center of the first membrane 602 are associated with the same frequency $f_n$. Also, respective pairs of the third membranes 606 disposed along an axis passing through the center of the first membrane 602 are associated with the same frequency $f_n$. Thus, a radiation pattern of waves emitted by the membranes 602, 604, 606 in the example of FIG. 6 is substantially symmetrical. The example membrane layout 600 can include fewer or additional membranes than shown in FIG. 6. For example, additional membrane(s) can be patterned to form a ring around the third membranes 606 to provide for additional frequencies.

FIG. 7 illustrates a second example membrane layout 700. The example membrane layout 700 of FIG. 7 includes a first membrane 702, a second membrane 704, a third membrane 706, a fourth membrane 708, and a fifth membrane 710. In the example of FIG. 7, the second membrane 704 is disposed opposite from, or across from, the fourth membrane 708 relative to the first membrane 204 and the third membrane 706 is disposed opposite from, or across from, the fifth membrane 710 relative to the first membrane 204. The second membrane 704, the third membrane 706, the fourth membrane 708, and the fifth membrane 710 are partially trapezoidal in shape. For example, the second membrane 704 includes a first edge 712, a second edge 714, a third edge 716 opposite the second edge 714, and a fourth (curved) edge 718 opposite the first edge 712, wherein a width of the second membrane 704 decreases between the first edge 712 and the fourth edge 718. Also, edges 712 of the second, third, fourth, and fifth membranes 704, 706, 708, 710 (e.g., edges of the piezoelectric layer 222, edges of the diaphragm 512) distal from the first membrane 702 are substantially straight such that the example layout 700 of FIG. 7 forms a substantially square shape. For instance, the respective edges 712 of the second membrane 704 and the fourth membrane 708 are parallel to one another. Also, the respective edges 712 of the third membrane 706 and the fifth membrane 710 are parallel to one another.

As illustrated in FIG. 7, the first membrane 702 is associated with a first frequency $f_1$, the second and fourth membranes 704, 708 are associated with a second frequency $f_2$, and the third and fifth membranes 706, 710 are associated with a third frequency $f_3$. Thus, a radiation pattern of waves emitted by the membranes 702, 704, 706, 708, 710 of FIG. 7 is substantially symmetrical. The membranes 702, 704, 706, 708, 710 can be formed via etching and/or patterning materials used to form a transducer including the example membrane layout 700 of FIG. 7, such as the piezoelectric material 222 of FIGS. 2 and 4, the diaphragm 512 of FIG. 5, the top electrode(s) 224, 518 of FIGS. 2, 4, and 5. The example membrane layout 700 can include fewer or additional membranes than shown in FIG. 7.

FIG. 8 illustrates a third example membrane layout 800. The third example membrane layout 800 includes a first membrane 802 and a second membrane 804 patterned as a ring around the first membrane 802. The example membrane layout 800 can include n additional membranes patterned as rings around the first and second membranes 802, 804 based on, for instance, a desired frequency range of a transducer including the third example membrane layout 800. Each of the membrane ring(s) can be associated with different frequencies $f_n$. In some examples, the membrane layout 800 of FIG. 8 is selected to increase an ultrasonic sound pressure of waves output by the transducer due to the concentric ring design of the membranes. The membranes 802, 804, 806 can be formed via etching and/or patterning materials used to form a transducer including the example membrane layout 800 of FIG. 8, such as the piezoelectric material 222 of FIGS. 2 and 4, the diaphragm 512 of FIG. 5, the top electrode(s) 224, 518 of FIGS. 2, 4, and 5. The example membrane layout 800 can include fewer or additional membranes than shown in FIG. 8 (e.g., two membranes, nine membranes, n membranes).

Figure 9:
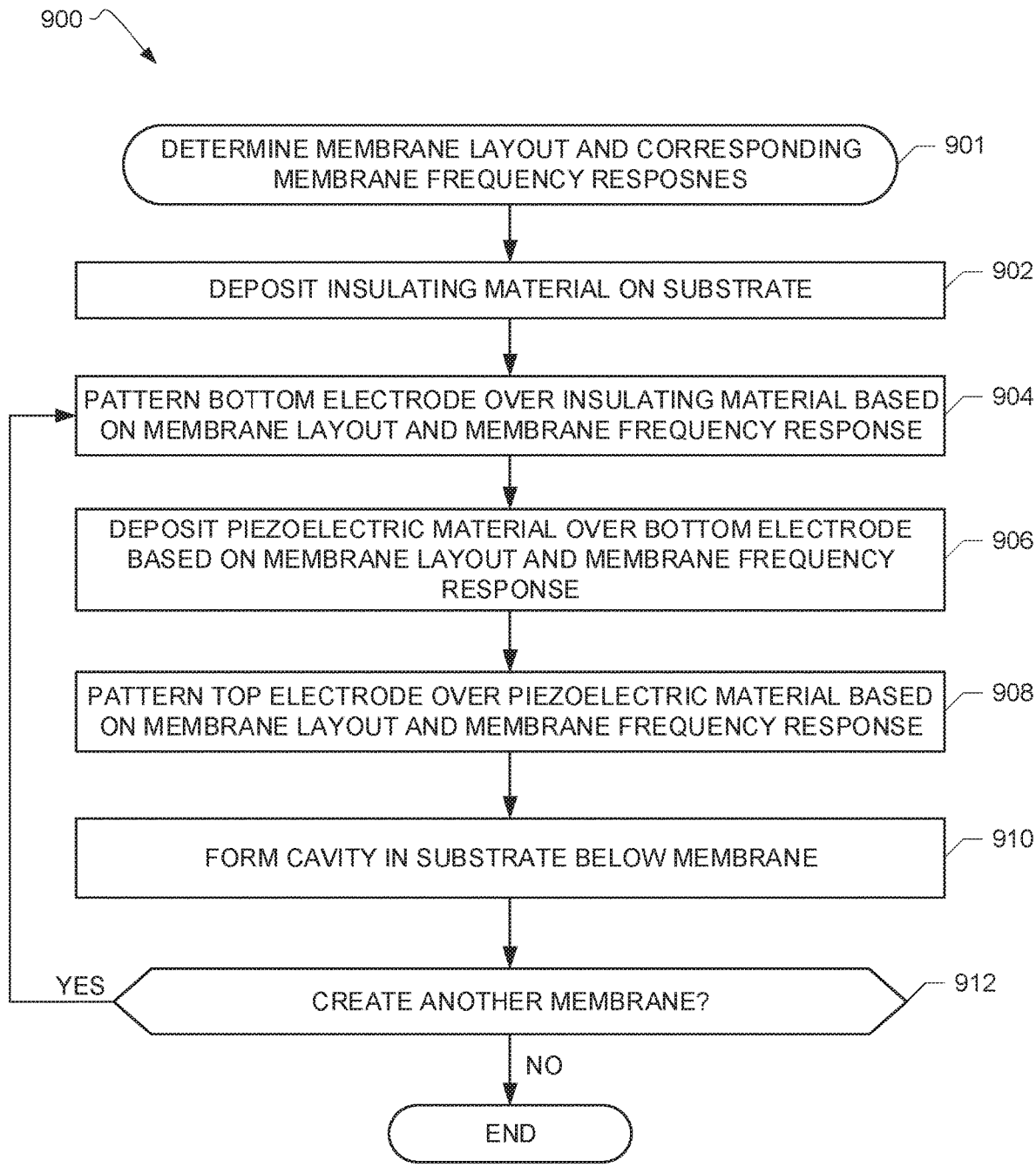
FIG. 9 is a flowchart of an example method to manufacture the first example transducer of FIGS. 2-4.

FIG. 9 is a flowchart of an example method 900 to manufacture the example piezoelectric transducer 200 of FIGS. 2-4 having membranes arranged in a particular membrane layout (e.g., the example membrane layouts of FIGS. 3, 6-8), where the membranes exhibit respective frequency responses when, for instance, the membranes are excited via electrical stimulation. At block 901, a layout of the membranes and the corresponding frequency responses to be exhibited by the membranes are determined. For example, a number of membranes, a size of the respective membranes, a shape of the respective membranes, a thickness of one or more materials forming the respective membranes, and/or, a stiffness of the material(s) forming the respective membranes can be selected to create membranes exhibiting particular frequency responses. For example, a smaller sized membrane can be associated with a higher frequency response as compared to a larger sized membrane. The layout of the membranes can be determined based on, for example, the selected shapes and/or sizes of the membranes, the number of membranes, a size of a substrate on which the membranes are to be formed, a form factor of the transducer, etc. At block 902, the insulating material 402 is deposited on the first substrate 202. At block 904, the bottom electrode 404 is patterned over the insulating material 402 corresponding to locations relative to the first substrate 202 at which the membranes are to be formed, based on the membrane layout. For example, the bottom electrode 404 can be patterned over an area of the first substrate 202 and the insulating material 402 that is to support the membrane based on the membrane layout.

At block 906, the piezoelectric material 222 is deposited over the bottom electrode 404 based on the membrane layout and the frequency response to be exhibited by the membrane. For example, the piezoelectric material 222 can be patterned or etched to have a particular shape (e.g., a ring shape, a trapezoidal shape) based on the membrane layout as shown in, for instance, any of FIGS. 3 and 6-8. A thickness and/or size of the piezoelectric layer 222 can be based on the particular frequency response to exhibited by the membrane. At block 908, the top electrode 224 is patterned over the piezoelectric material 222 based on the membrane layout and frequency response to be exhibited by the membrane. For example, as shown in FIG. 2, the top electrode 224 has a similar shape as the piezoelectric layer 222 forming the respective membranes 204, 206, 208, 210, 212, 214, 216, 218, 220 of the example transducer 200.

At block 910, the first substrate 202 is etched to form the cavity 408, thereby releasing the membrane including bottom electrode 404, the piezoelectric layer 222, and the top electrode 224 for movement when subjected to, for instance, electrical stimulation. If another membrane is to be created (block 912), then the example method 900 returns to forming the membrane by depositing and patterning the bottom electrode 404, the piezoelectric layer 222, and the top electrode 224 in accordance with the membrane layout and corresponding frequency response for the membrane (blocks 904-908).

Although the example method 900 is described with reference to the flowchart illustrated in FIG. 9, many other methods of manufacturing the example transducer 200 of FIGS. 2-4 may alternatively be used. For example, the order of execution of the blocks may be changed, and/or some of the blocks described may be changed, eliminated, or combined. Similarly, additional operations may be included in the manufacturing process before, in between, or after the blocks shown in FIG. 9.

Figure 10:
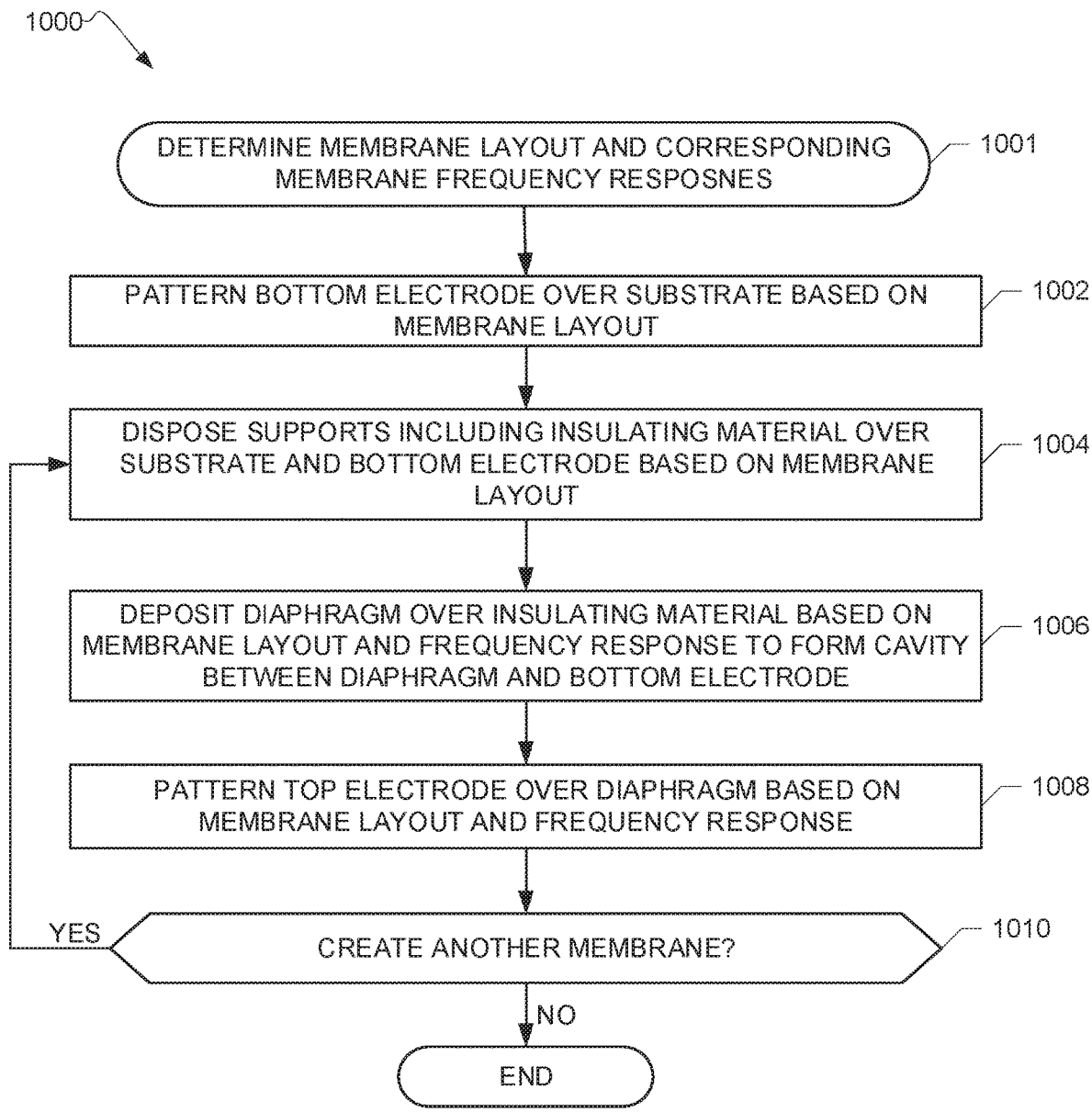
FIG. 10 is a flowchart of an example method to manufacture the second example transducer of FIG. 5.

FIG. 10 is a flowchart of an example method 1000 to manufacture the example capacitive transducer 500 of FIG. 5 having membranes arranged in a particular membrane layout (e.g., the example membrane layouts of FIGS. 3, 6-8), where the membranes exhibit respective frequency responses when, for instance, the membranes are excited via electrical stimulation. At block 1001, a layout of the membranes and the corresponding frequency responses to the exhibited by the membranes are determined. For example, a number of membranes, a size of the respective membranes, a shape of the respective membranes, a thickness of one or more materials forming the respective membranes, and/or, a stiffness of the material(s) forming the respective membranes can be selected to create membranes exhibiting particular frequency responses. For example, a smaller sized membrane can be associated with a higher frequency response as compared to a larger sized membrane. The layout of the membranes can be determined based on, for example, the selected shapes and/or sizes of the membranes, the number of membranes, a size of a substrate on which the membranes are to be formed, a form factor of the transducer, etc. At block 1002, the bottom electrode 510 is patterned on the substrate 508. For example, the bottom electrode 510 can be patterned over an area of the substrate 508 that is to support the membrane based on the membrane layout. At block 1004, the supports including the insulating material 514 are disposed over the substrate 508 and the bottom electrode 510 based on the membrane layout. The insulating material 514 can be deposited based on a location of membrane in the membrane layout.

At block 1006, the diaphragm 512 is deposited over the insulating material 514, to form the cavity 516 between diaphragm 512 and the bottom electrode 510. The diaphragm 512 is deposited based on the membrane layout and the frequency response to be exhibited by the membrane. For example, a thickness of the diaphragm 512 can be based on the frequency response to be exhibited by the membrane.

At block 1008, the top electrode 518 is patterned over the diaphragm 512. The shape and/or size of the top electrode 518 is based on the membrane layout and the frequency response to be exhibited by the membrane formed from the diaphragm 512 and the top electrode 518. If another membrane is to be created (block 1010), then the example method 1000 returns to forming the membrane in accordance with the membrane layout and corresponding frequency response for the membrane (blocks 1004-1008).

Although the example method 1000 is described with reference to the flowchart illustrated in FIG. 10, many other methods of manufacturing the example transducer 500 of FIG. 5 may alternatively be used. For example, the order of execution of the blocks may be changed, and/or some of the blocks described may be changed, eliminated, or combined. Similarly, additional operations may be included in the manufacturing process before, in between, or after the blocks shown in FIG. 10.

Figure 11:
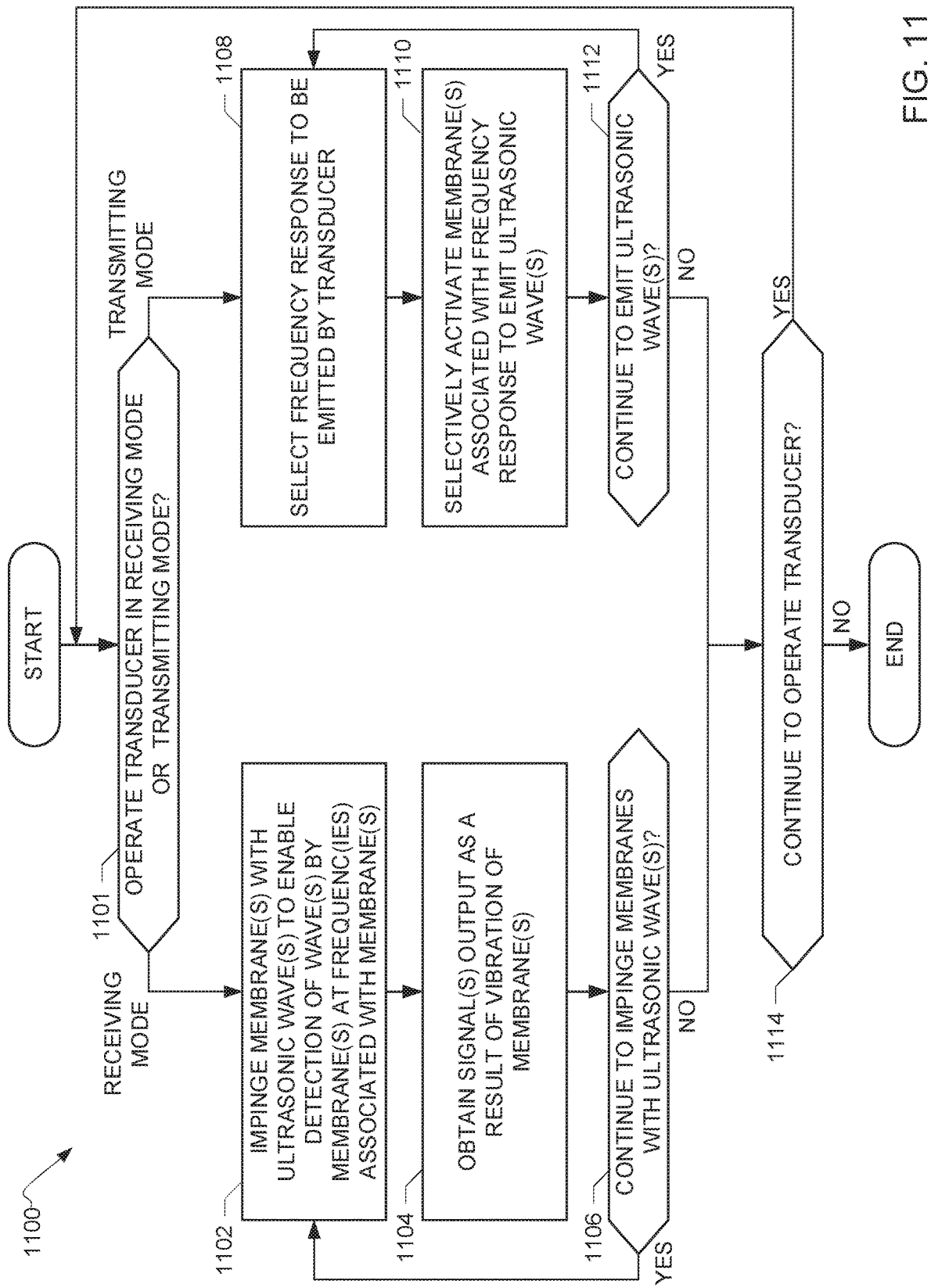
FIG. 11 is a flowchart of an example method of operation of the first example transducer of FIGS. 2-4 and/or the second example transducer of FIG. 5.

FIG. 11 is a flowchart of an example method of operation of the example piezoelectric transducer 200 of FIGS. 2-4 and/or the example capacitive transducer 500 of FIG. 5. As mentioned above, the example transducers 200, 500 can be used to detect or receive ultrasonic waves or to emit ultrasonic waves. At block 1101, a decision is made whether to operate the transducer 200, 500 in a receiving mode to detect ultrasonic waves or a transmitting mode to emit ultrasonic waves. When the transducer 200, 500 is operated in the receiving mode, block 1102 of the example method 1100 of FIG. 11 includes impinging the membrane(s) of the transducer 200, 500 (e.g., the membrane(s) 204, 206, 208, 210, 212, 214, 216, 218, 220 of the transducer 200 of FIGS. 2-4, the membrane(s) 502, 504, 506 of the transducer 500 of FIG. 5) with ultrasonic wave(s). Impinging the membrane(s) with ultrasonic wave(s) enables detection of the wave(s) by the transducer 200, 500 at the frequenc(ies) associated with the respective membrane(s). As discussed above, the transducer 200, 500 can detect waves at a variety of frequencies based on the different frequency responses of the membranes. In some examples, the ultrasonic wave(s) are received by each of the membranes of the transducer 200, 500 to cause each of the membranes to vibrate at the respective resonant frequencies in parallel to generate a broadband radiation pattern. At block 1104, signal(s) output by the membrane(s) as a result of the receipt of the ultrasonic wave(s) are output (e.g., for storage, processing, analysis). For example, changes in capacitance when the membrane(s) of the example capacitive transducer 500 vibrate can be sensed and output as signal data. The example transducer 200, 500 continues to operate in receiving mode until the membrane(s) are no longer to be impinged with ultrasonic wave(s) (block 1106).

If the transducer 200, 500 is operated in the transmitting mode, block 1108 of the example method 1100 include selecting the frequency response to be emitted by the transducer 200, 500. The frequency response to be emitted by the transducer 200, 500 is selected based on, for instance, the frequency range of the transducer. The frequency range of the transducer 200, 500 can be defined by the frequency responses provided by the membrane(s) of the transducer 200, 500 (e.g., the membrane(s) 204, 206, 208, 210, 212, 214, 216, 218, 220 of the transducer 200 of FIGS. 2-4, the membrane(s) 502, 504, 506 of the transducer 500 of FIG. 5).

At block 1110, the membrane(s) of the transducer 200, 500 associated with the selected frequency response are activated. For example, the second and sixth membranes 206, 214 of the piezoelectric transducer 200 of FIGS. 2-4 can be activated by the respective electrical bond pads 226 electrically coupled to the second and sixth membranes 206, 214 via the electrical traces 228. For example, a voltage can be applied to the second and sixth membranes 206, 214 via the respective electrical bond pads 226. Electrical stimulation of the second and sixth membranes 206, 214 causes the second and sixth membranes 206, 214 to emit ultrasonic waves at the second frequency $f_2$, or the frequency of oscillation of the membranes 206, 214. In some examples, all of the membranes of the transducer 200, 500 are excited in parallel to cause each of the membranes to vibrate at the respective resonant frequencies to generate to increase a bandwidth range of the transducer 200, 500. The example transducer 200, 500 continues to operate in transmitting mode until no further waves are to be emitted (block 1112). The example method 1100 ends when the transducer 200, 500 is no longer to be operated (block 1114).

Although the example method 1100 is described with reference to the flowchart illustrated in FIG. 11, many other methods of operating the example transducer 200 of FIGS. 2-4 and/or the example transducer 500 of FIG. 5 may alternatively be used. For example, the order of execution of the blocks may be changed, and/or some of the blocks described may be changed, eliminated, or combined. Similarly, additional operations may be included in the manufacturing process before, in between, or after the blocks shown in FIG. 11.

From the foregoing, it will be appreciated that example apparatus and methods have been disclosed that provide for ultrasonic transducers including a plurality of membranes associated with different frequency responses to increase broadband capabilities of the transducers. Example transducers disclosed herein include membranes arranged in particular layouts to maximize an area of the transducer that is capable of detecting or responding to ultrasound waves. In some examples, respective membranes of the transducers are associated with different frequency responses to enable the transducers to respond to or emit waves at a variety of frequencies. In some examples, the membranes associated with the same frequency response are selectively arranged provide for substantially radiation patterns of waves emitted by the transducers.

Although certain example methods, apparatus and articles of manufacture have been disclosed herein, the scope of coverage of this patent is not limited thereto. On the contrary, this patent covers all methods, apparatus and articles of manufacture fairly falling within the scope of the claims of this patent.

What is claimed is:

1. An ultrasonic transducer, comprising:
   a first substrate;
   a first membrane having a first resonant frequency;
   a second membrane having a second resonant frequency different from the first resonant frequency;
   a third membrane disposed opposite the second membrane relative to the first membrane, having a same shape and same dimensions as the second membrane, and having the second resonant frequency, a shape of the first membrane being different from a shape of the second and third membranes;
   wherein, the first, second and third membranes include:
      a top electrode;
      a piezoelectric layer having opposite first and second surfaces, wherein the first surface of the piezoelectric layer is disposed on the top electrode;
      a bottom electrode having opposite first and second surfaces, wherein the first surface of the bottom electrode is disposed on the second surface of the piezoelectric layer, the second surface of the bottom electrode is disposed on the first substrate, and the bottom electrode is patterned from a film including titanium and platinum, and is a ground electrode for the top electrode; and
      an insulator having opposite first and second surfaces, in which the first surface of the insulator is disposed on the second surface of the bottom electrode, and the second surface of the insulator is disposed on the first substrate; and
   a second substrate having electrical bond pads, wherein the second substrate is bonded to the first substrate, and the electrical bond pads are coupled to electrodes of the first, second and third membranes to provide electrical connections between the ultrasonic transducer and other circuitry coupled to the second substrate.

2. The ultrasonic transducer of claim 1, wherein the first membrane, the second membrane, and the third membrane are disposed along an axis passing through the first membrane.

3. The ultrasonic transducer of claim 2, wherein the third membrane is at least partially disposed about the second membrane.

4. The ultrasonic transducer of claim 1, wherein the second membrane and the third membrane are ring-shaped.

5. The ultrasonic transducer of claim 1, wherein the piezoelectric layer is replaced by a capacitive transducer, the capacitive transducer including:
   a substrate; and
   a diaphragm spaced from the substrate by insulating supports.

6. The ultrasonic transducer of claim 1, wherein the first membrane includes a diaphragm and a first electrode, the diaphragm and the first electrode spaced apart from a second electrode by a cavity.

7. The ultrasonic transducer of claim 1, further comprising:
   a fourth membrane having a third resonant frequency different from the first resonant frequency or the second resonant frequency; and
   a fifth membrane disposed opposite the fourth membrane relative to the first membrane and along an axis passing through the first membrane, having a same shape and dimensions as the fourth membrane, and having the third resonant frequency.

8. A method to manufacture an ultrasonic transducer, the method comprising:
   providing a first substrate;
   patterning a first membrane on the first substrate, the first membrane having a first resonant frequency;
   patterning a second membrane on the first substrate, the second membrane having a second resonant frequency different from the first resonant frequency; and patterning a third membrane on the first substrate opposite the second membrane relative to the first membrane and along an axis passing through the first membrane, having a same shape and same dimensions as the second membrane, and having the second resonant frequency;

providing a second substrate having electrical bond pads, wherein the second substrate is bonded to the first substrate, and the electrical bond pads are coupled to electrodes of the first, second and third membranes to provide electrical connections between the ultrasonic transducer and other circuitry coupled to the second substrate;

wherein, the first, second and third membranes include:
a top electrode;
a piezoelectric layer having opposite first and second surfaces, in which the first surface of the piezoelectric layer is disposed on the top electrode;
a bottom electrode having opposite first and second surfaces, in which the first surface of the bottom electrode is disposed on the second surface of the piezoelectric layer, the second surface of the bottom electrode is disposed on the first substrate, and the bottom electrode is patterned from a film including titanium and platinum, and is a ground electrode for the top electrode; and
an insulator having opposite first and second surfaces, in which the first surface of the insulator is disposed on the second surface of the bottom electrode, and the second surface of the insulator is disposed on the first substrate.

9. The method of claim 8, wherein a thickness of the piezoelectric layer is based on the first resonant frequency.

10. The method of claim 8, wherein the first membrane has a circular shape.

11. The method of claim 10, wherein patterning the second membrane includes patterning an edge of a piezoelectric layer of the second membrane distal from the first membrane to be substantially straight.

12. The method of claim 8, wherein patterning the first membrane includes depositing a diaphragm over an insulating material to form a cavity between the diaphragm and the first substrate.

13. The method of claim 8, further including electrically coupling the first membrane, the second membrane, and the third membrane to respective electrical bond pads.

14. A method for transmitting ultrasonic waves, the method comprising:
electrically stimulating a first membrane of an ultrasonic transducer, causing the first membrane to transmit a first wave at a first frequency; and
electrically stimulating a second membrane of the ultrasonic transducer, causing the second membrane to transmit a second wave at a second frequency, wherein the second frequency is different from the first frequency;
electrically stimulating a third membrane of the ultrasonic transducer, causing the third membrane to transmit a third wave at the second frequency, wherein the third membrane is patterned opposite the second membrane relative to the first membrane and along an axis passing through the first membrane, and the third membrane has a same shape and same dimensions as the second membrane;
wherein, the ultrasonic transducer includes a first substrate, and the first, second and third membranes are patterned on the first substrate and include:
a top electrode;
a piezoelectric layer having opposite first and second surfaces, in which the first surface of the piezoelectric layer is disposed on the top electrode;
a bottom electrode having opposite first and second surfaces, in which the first surface of the bottom electrode is disposed on the second surface of the piezoelectric layer, the second surface of the bottom electrode is disposed on the first substrate, and the bottom electrode is patterned from a film including titanium and platinum, and is a ground electrode for the top electrode; and
an insulator having opposite first and second surfaces, in which the first surface of the insulator is disposed on the second surface of the bottom electrode, and the second surface of the insulator is disposed on the first substrate; and
wherein the ultrasonic transducer includes a second substrate having electrical bond pads, wherein the second substrate is bonded to the first substrate, and the electrical bond pads are coupled to electrodes of the first, second and third membranes to provide electrical connections between the ultrasonic transducer and other circuitry coupled to the second substrate.

15. The method of claim 14, wherein the second membrane and the third membrane are electrically stimulated in parallel.

16. The method of claim 14, further including electrically stimulating fourth and fifth membranes to transmit fourth and fifth waves, respectively, the fourth and fifth waves having a third frequency different from the first frequency and the second frequency.

* * * * *